United States Patent [19]

Sechi

[11] 3,997,851
[45] Dec. 14, 1976

[54] RF-DRIVE EQUALIZER FOR MULTICELL MICROWAVE TRANSISTOR

[75] Inventor: Franco Nicola Sechi, Lawrence Township, N.J.

[73] Assignee: The United States of America as represented by the Secretary of the Army, Washington, D.C.

[22] Filed: Jan. 28, 1976

[21] Appl. No.: 653,049

[52] U.S. Cl. .............................. 330/31; 330/30 R; 330/53; 330/56; 333/84 M
[51] Int. Cl.² ....................... H03F 3/04; H01P 3/00
[58] Field of Search ............. 330/21, 30 R, 31, 56, 330/53, 38 M; 333/84 M

[56] References Cited
UNITED STATES PATENTS 3,419,813   12/1968   Kamnitsis ....................... 330/56 X
3,869,678   3/1975   Mahoney ..................... 330/30 R X Primary Examiner—R. V. Rolinec
Assistant Examiner—Lawrence J. Dahl
Attorney, Agent, or Firm—Nathan Edelberg; Robert P. Gibson; Michael J. Zelenka

[57] ABSTRACT

A device which provides for uniform driving of a series of microwave transistors connected in parallel in a transistor pellet by utilizing a series of parallel microwave transmission lines of differing widths said widths being selected so as to compensate for the unequal effect of mutual inductance among the bond wires connecting said microwave transmission lines to the transistor pellet.

7 Claims, 1 Drawing Figure

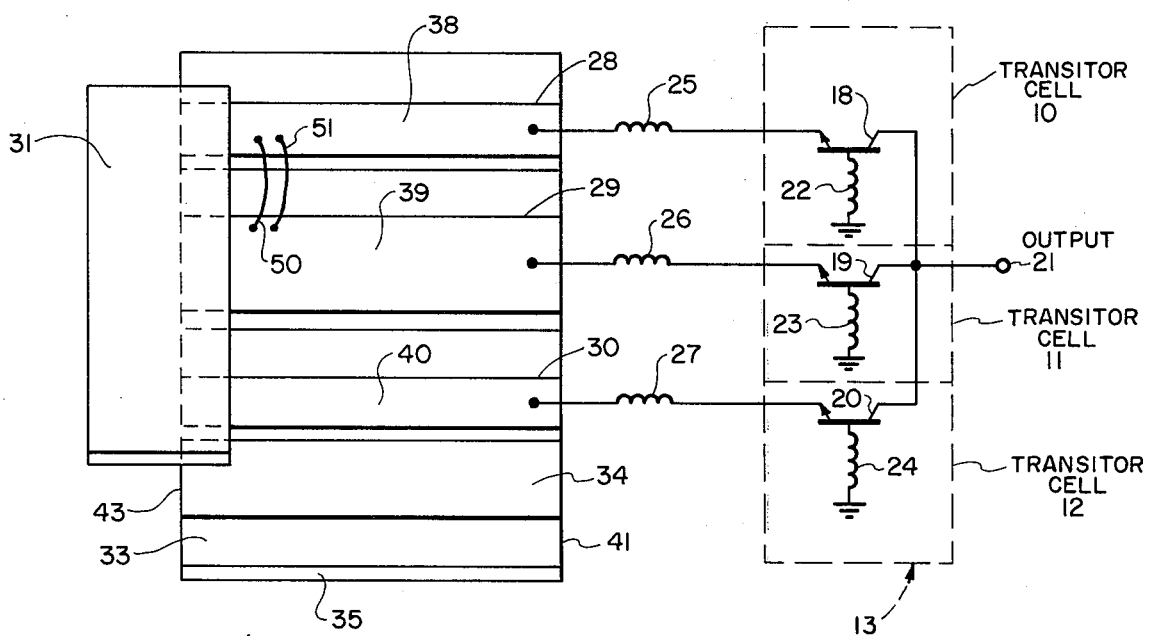

RF-DRIVE EQUALIZER FOR MULTICELL MICROWAVE TRANSISTOR

DISCUSSION OF THE PRIOR ART

The problem of efficient paralleling of power transistors at R.F. frequencies has long been recognized. High frequency transistors are generally small in size and have a correspondingly low power handling capability. A well known configuration of a high power, high frequency transistor amplifier circuit entails connecting the transistors in parallel with like terminals of the respective transistors coupled together. Toward this end the present art provides for the fabrication of high power, microwave transistor pellets. Each such pellet provides a series of transistors, each separated from the other by a specified distance, the outputs of which are connected in parallel and for which individual input terminals are provided. Ideally, when this combination is operating, the current and the R.F. power are uniformly distributed among the individual transistor elements. In actuality this is seldom the case, and a sharing problem is normally experienced for two reasons; first, due to variations in the high frequency characteristics of the individual transistors, especially variations in transistor input impedance, and second due to variations in the impedance of the circuitry coupling the input signal to each individual transistor. These problems have been dealt with in U.S. Pat. No. 3,327,238. Parallel Active Circuit Elements with Provision for Power Distribution, Harwood et al, and U.S. Pat. No. 3,977,032, Paralleling Active Circuit Elements, Bailey et al. These patents teach the use of an inductive and capacitive coupling network designed so as to provide interstage isolation and minimize the effect of inherent input impedance differences of the individual transistors.

Presently, it is common practice to use a microstrip transmission line to carry the signal from the source to a point in close proximity to the transistor inputs. From this point bond wires are used to connect each transistor input terminal to the microstrip. These bond wires appear as inductors at the frequency in question. A common problem experienced in this configuration is the unequal effect of mutual inductances among the bond wires, the innermost wires experiencing more of a mutual inductance effect than the outermost. In the past this problem has been solved by lengthening the outermost bond wires. This lengthening, of course, increases the inherent inductances of those leads thereby compensating for the increased inductance of the inner leads resulting from the greater effect of mutual inductance. This method of compensation however is undesireable since it is done essentially empirically on a case by case basis and because of the difficulty of controlling the length of the bond wires accurately. The object of this invention therefore is to provide a circuit configuration which compensates for the differences in mutual inductance among the bond wires and provides equal power to each transistor in a transistor pellet while maintaining an ease of duplication which permits the configuration to lend itself to production situations.

SUMMARY OF THE INVENTION

The present invention overcomes the problems of unequal effects of mutual inductances among the power transistor bond wires by providing a plurality of individual microstrip feed lines, the number of which equal the number of transistors in the transistor pellet which are to be utilized. Each microstrip feed line is connected to a transistor input by a bond wire, the length of the bond wires being equal. As explained previously, the total inductance of each bond wire will differ due to the unequal effect of mutual inductances among all the bond wires. This inequality in the effect of mutual inductance among the bond wires is compensated for by providing microstrips of different widths thereby changing the self inductance of each strip in order to provide the same total inductance between the signal source and the transistor input for each coupling path. The approach may be applied to a device with any number of cells with very low losses.

The advantages of the invention derive from the fact that the array of transmission lines can be accurately computed and readily implemented by the use of standard photolithographic techniques. Further, the invention provides for a minimization of bond wire length and accordingly a minimization of input losses, a particularly important parameter in high power microwave devices.

BRIEF DESCRIPTION OF THE DRAWING

The FIGURE shows the equivalent circuit of a three cell device together with a transmission line feed having independent microstrips of varying inductance as taught by the invention.

DETAILED DESCRIPTION OF THE INVENTION

The FIGURE illustrates a transistor pellet 13 having three transistor cells 10, 11, 12 spaced sufficiently distant from each other to provide adequate heat sinking. As illustrated the outputs of the transistors 18, 19, 20 are connected in parallel internal to the pellet and a sole output terminal 21 is provided. The internal input inductances 22, 23, 24 of each transistor are represented as running from the base to ground in each instance.

Also illustrated are three microstrip transmission lines 28, 29, 30 which are coupled to a common input contact 31. The three microstrip transmission lines are formed by a dielectric substrate 33 having a planar ground conductor 35 covering the bottom surface of that substrate and three narrow strip-like conductors 38, 39, 40 on the top surface 34 of the substrate. The narrow strip-like conductors extend from the end 41 of the substrate nearest to the transistor pellet 13 to the opposite end 43 and make electrical contact to the common contact 31 near the end 43. The length of the microstrip lines, 28, 29, 30, the width of the narrow strip-like conductors 38, 39, 40 and the spacing between the narrow strip like conductors 38, 39, 40 and the planar ground conductor 35 are initially selected to provide a good impedance match to the transistor cells 10, 11, 12.

Bonding wires 25, 26, 27 couple the microstrip transmission lines 28, 29, 30 to the transistor cells 10, 11, 12. In the FIGURE these bonding wires 25, 26, 27 are represented as including coils. In actuality they are not coils as such but merely behave as coils at microwave frequencies providing both individual wire inductances and mutual inductances among themselves. If $L_1$, $L_2$ and $L_3$ are the self inductances of the bond wires connecting the transistors to the input line and if we assume a symmetrical structure such that $L_1 = L_2 = L_3 = L$ and negligible coupling between the two outside bond wires 25, 27 (eg. $M_{25,27} = 0$) the total inductance in the central bond wire 26 equals L plus 2M. Similarly the total inductance in the outer bond wires 25, 27 equals L plus M. The lower inductance of the two outer bond wires 25, 27 is what led to R.F. overdrive in prior art applications where a single microstrip transmission line was used to provide an R.F. drive to all the cells. In the present invention although the unequal effect of the mutual inductance among the bond wires 25, 26, 27 still exists it is overcome by adjusting the relative widths of the strip-like conductors 38, 39, 40 such that the outer narrow strip-like conductors 38 and 40 are less wide than the inner narrow strip-like conductor 39, causing an increase in the characteristic impedance of the two outer transmission lines 28, 30 and equalization of the R.F. drive.

While the example given was for a three cell device, the invention is equally applicable to an $n$ cell unit. In general for an $n$ cell device it can be shown that the effective inductance of the $i$-th bond wire can be written as $$L_{eff} = \sum_{j=1}^{n} M_{ij}$$

where $M_{ij}$ are the mutual inductances of the $i$-th wire with the other $n-1$ wires and $M_{ii}$ is the self-inductance of the wire. When the various $L_{eff}$ are known, either by computation or measurement, it is a rather simple matter to design the various microstrip transmission lines such that equal R.F. power is supplied to each cell. Obviously the cells coupled by the bond wires having the lowest effective inductance will require transmission lines with a higher relative impedance.

Since the various transistor cells are often not identical it is desirable to provide some means of trimming the design to provide optimum performance. This may be easily accomplished by bridging the gaps between the transmission lines with bond wires, metal straps or conductive epoxy 50, 51 near the common input contact. So bridging these gaps will slightly raise the input impedance of the outer cells and thus reduce the R.F. power to those cells.

What is claimed is:

1. An R.F. drive system to couple a series of discrete transistor cells in a power transistor pellet with a common input contact comprising a series of transistor bond wires and a series of microstrip transmission lines wherein each microstrip transmission line is coupled at one end to the common input contact and at the other end to a discrete transistor bond wire, which couples a single transistor to the microstrip transmission line, and wherein the width of the microstrip transmission lines differ so as to compensate for the unequal effects of mutual inductance among the bond wires.

2. The R.F. drive system of claim 1 wherein the bond wires are of equal length.

3. The R.F. drive system of claim 2 wherein the microstrip transmission lines are of equal length.

4. The R.F. drive system of claim 1 further including strap connections across the microstrip transmission lines to compensate for differences in transistor input impedances.

5. An R.F. drive system to couple three equi-spaced R.F. power transistors connected in parallel and having mutually inductive transistor bond wires attached to an R.F. source comprising three equi-spaced parallel microstrip transmission lines each coupled at one end to the R.F. source and at the other to a transistor bond wire so that each transistor has associated with it an individual microstrip transmission line and wherein the microstrip transmission lines differ in width, the two outside microstrip transmission lines being equal in width and narrower than the center microstrip transmission line so as to compensate for unequal mutual inductance among the bond wires, whereby the R.F. drive to each transistor is equalized.

6. In an R.F. drive system for a power transistor pellet of the type which utilizes a microstrip feed line to couple a common input contact and the individual transistor bond wires, an improved microstrip feed, comprising a series of microstrip transmission lines, of uniform length, each coupled to the common input contact at one end and to a discreet transistor bond wire at the other end and differing in width so as to compensate for the unequal effects of mutual inductance among the bond wires.

7. The improved microstrip feed of claim 3 having strap connections between the microstrip transmission lines to compensate for variances in transistor input impedance.

* * * * *